(12) United States Patent
LaTorre et al.

(10) Patent No.: US 12,137,532 B2
(45) Date of Patent: *Nov. 5, 2024

(54) ADJUSTABLE AIRFLOW DUCT

(71) Applicant: Mastercard International Incorporated, Purchase, NY (US)

(72) Inventors: Michael LaTorre, Wright City, MO (US); Travis McClintock, St. Charles, MO (US)

(73) Assignee: Mastercard International Incorporated, Purchase, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 18/497,995

(22) Filed: Oct. 30, 2023

(65) Prior Publication Data

US 2024/0064929 A1 Feb. 22, 2024

Related U.S. Application Data

(63) Continuation of application No. 17/546,429, filed on Dec. 9, 2021, now Pat. No. 11,805,619.

(60) Provisional application No. 63/123,090, filed on Dec. 9, 2020.

(51) Int. Cl.
*H05K 7/20* (2006.01)

(52) U.S. Cl.
CPC ..... *H05K 7/20145* (2013.01); *H05K 7/20736* (2013.01)

(58) Field of Classification Search
CPC ........... H05K 7/20736; H05K 7/20727; H05K 7/1489; H05K 7/20; H05K 7/20572; H05K 7/1488; H05K 7/20145; H05K 7/20709; H05K 7/20781; H05K 5/0217; G06F 1/20; G06F 1/16; F24F 13/02
USPC .......................................................... 361/695
See application file for complete search history.

(56) References Cited

U.S. PATENT DOCUMENTS

| 2012/0012279 | A1* | 1/2012 | Appino | H05K 7/1489 |
| | | | | 165/104.11 |
| 2013/0161277 | A1* | 6/2013 | Augsburger | H05K 7/20727 |
| | | | | 211/175 |
| 2016/0128226 | A1* | 5/2016 | Stellick | H05K 7/20727 |
| | | | | 361/679.46 |
| 2017/0332509 | A1* | 11/2017 | Miyatsu | G06F 1/186 |
| 2018/0035571 | A1* | 2/2018 | Grinberg | H05K 7/20736 |

(Continued)

*Primary Examiner* — Mandeep S Buttar
(74) *Attorney, Agent, or Firm* — Hovey Williams LLP

(57) ABSTRACT

A data center rack assembly includes a rack, an electronic device, and an adjustable air duct. The rack includes a frame defining opposite first and second rack sides spaced apart in a longitudinal direction. The electronic device presents an intake side configured to receive air therethrough for passage into the electronic device. The electronic device is mounted to the frame such that the intake side is disposed intermediately between the rack sides and is spaced from the first rack side to define a longitudinal dimension therebetween. The duct includes relatively shiftable first and second duct sections that extend in the longitudinal direction to cooperatively present an adjustable longitudinal duct length, and a drive mechanism operably coupled to the first and second sections to control relative shifting of the sections in the longitudinal direction to thereby adjust the longitudinal duct length to correspond with the longitudinal dimension.

20 Claims, 10 Drawing Sheets

(56) References Cited

U.S. PATENT DOCUMENTS

2018/0275729 A1\* 9/2018 Eriksen .................... G06F 1/20

\* cited by examiner

ADJUSTABLE AIRFLOW DUCT

CROSS REFERENCE TO RELATED APPLICATION

The present application is a continuation of U.S. patent application Ser. No. 17/546,429, filed Dec. 9, 2021, which claims priority from U.S. Provisional Application No. 63/123,090, filed Dec. 9, 2020, each of which is entitled ADJUSTABLE AIRFLOW DUCT, and each of which is hereby incorporated in its entirety by reference herein.

BACKGROUND OF THE INVENTION

1. Field of the Invention

The present invention relates generally to an adjustable airflow duct for use in a data center cabinet or rack.

2. Discussion of the Prior Art

Those of ordinary skill in the art will appreciate that data centers often include multiple cabinets or racks in which various hardware devices are supported. For instance, one or more servers, routers, security appliances, controllers, hard drives, switches, and so on might be supported in a given cabinet or rack. Such devices may include an air intake portion that draws in adjacent air. In some instances, the adjacent air may be undesirably warm due to, among other factors, the position of the air intake portion within the rack or, more broadly, within the data center.

SUMMARY

According to one aspect of the present invention, a data center rack assembly comprises a rack, an electronic device, and an adjustable air duct. The rack includes a frame defining opposite first and second rack sides spaced apart in a longitudinal direction. The electronic device presents an intake side configured to receive air therethrough for passage into the electronic device. The electronic device is mounted to the frame such that the intake side is disposed intermediately between the rack sides and is spaced from the first rack side to define a longitudinal dimension therebetween. The duct includes relatively shiftable first and second duct sections that extend in the longitudinal direction to cooperatively present an adjustable longitudinal duct length. The duct further includes a drive mechanism operably coupled to said first and second sections to control relative shifting of the sections in the longitudinal direction to thereby adjust the longitudinal duct length to correspond with the longitudinal dimension.

Among other things, provision of a duct including relatively shiftable first and second duct sections that extend in the longitudinal direction to cooperatively present an adjustable longitudinal duct length, and a drive mechanism operably coupled to said first and second sections to control relative shifting of the sections in the longitudinal direction to thereby adjust the longitudinal duct length to correspond with the longitudinal dimension, facilitates efficient adjustment of the duct length to effectively direct cool air to an electronic device having an intake side positioned at any of numerous intermediate longitudinal positions.

This summary is provided to introduce a selection of concepts in a simplified form. These concepts are further described below in the detailed description of the preferred embodiments. This summary is not intended to identify key features or essential features of the claimed subject matter, nor is it intended to be used to limit the scope of the claimed subject matter.

Various other aspects and advantages of the present invention will be apparent from the following detailed description of the preferred embodiments and the accompanying drawing figures.

BRIEF DESCRIPTION OF THE DRAWING FIGURES

Preferred embodiments of the present invention are described in detail below with reference to the attached drawing figures, wherein.

Figure 1:
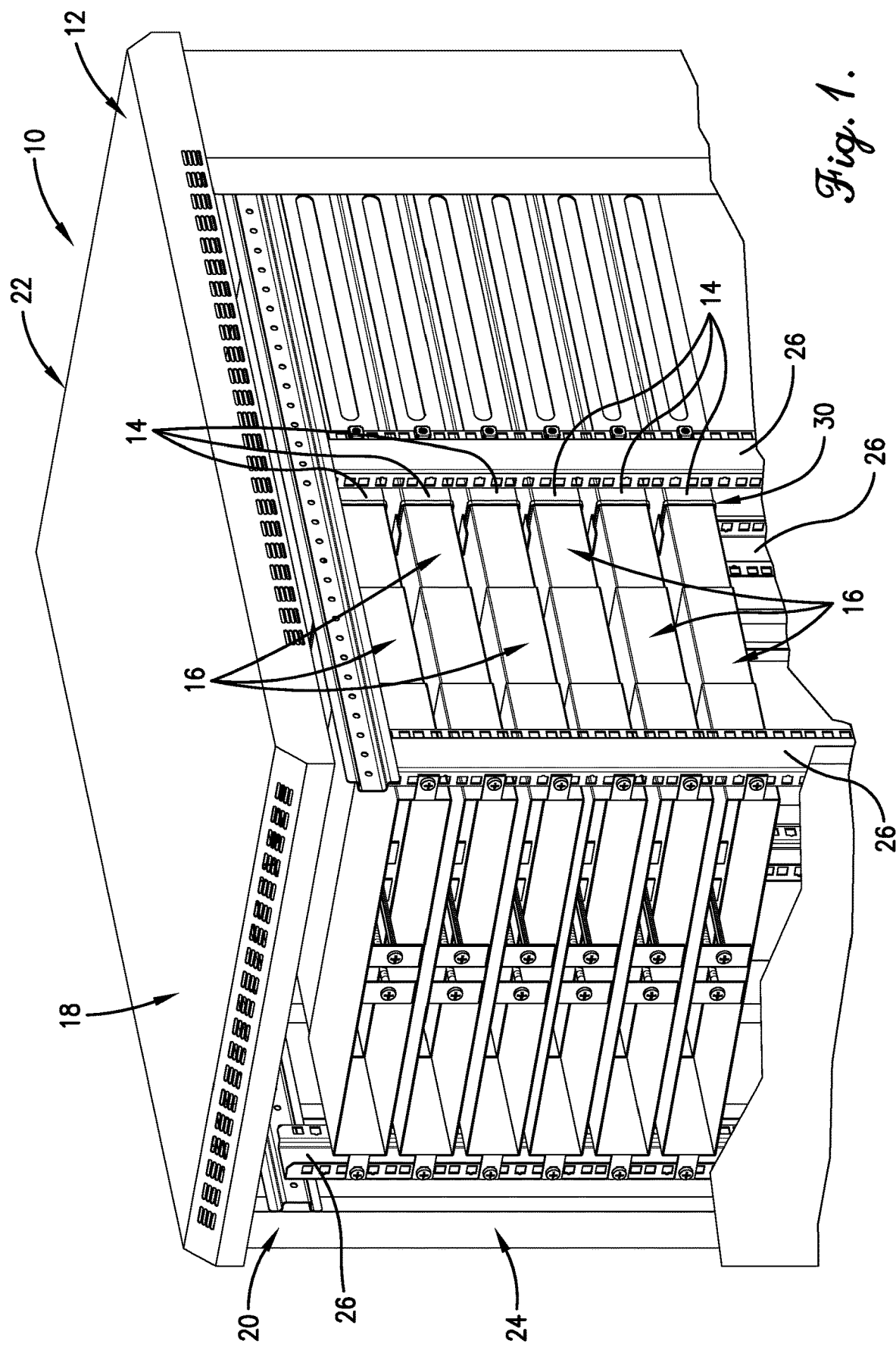
FIG. 1 is a partially fragmented front perspective view of a rack assembly in accordance with a first embodiment of the present invention, particularly illustrating a rack, a plurality of electronic devices mounted to the rack, and a plurality of adjustable airflow ducts corresponding to the electronic devices.

The drawing figures do not limit the present invention to the specific embodiments disclosed and described herein. While the drawings do not necessarily provide exact dimensions or tolerances for the illustrated structures or components, the drawings are to scale with respect to the relationships between the components of the structures illustrated in the drawings.

DETAILED DESCRIPTION

The present invention is susceptible of embodiment in many different forms. While the drawings illustrate, and the specification describes, certain preferred embodiments of the invention, it is to be understood that such disclosure is by way of example only. There is no intent to limit the principles of the present invention to the particular disclosed embodiments.

Furthermore, unless specified or made clear, the directional references made herein with regard to the present invention and/or associated components (e.g., top, bottom, upper, lower, inner, outer, etc.) are used solely for the sake of convenience and should be understood only in relation to each other. For instance, a component might in practice be oriented such that faces referred to as "top" and "bottom" are sideways, angled, inverted, etc. relative to the chosen frame of reference.

Data Center Rack Assembly

Turning now to FIG. 1, a data center rack assembly 10 is illustrated. The data center rack assembly 10 is preferably configured to be disposed in a data center or other facility associated with computing, electronics, or similar.

The data center rack assembly 10 preferably broadly includes a rack 12, a plurality of electronic devices 14, and a plurality of adjustable air ducts 16. In the illustrated embodiment, each electronic device 14 is associated with a corresponding duct 16, although it is permissible according to some aspects of the present invention for more or fewer ducts and/or electronic devices to be provided.

A variety of electronic devices fall within the scope of the present invention, including but not limited to servers, routers, switches, hubs, and so on.

The rack 12 includes a frame 18 defining opposite first and second sides 20 and 22, respectively, which are spaced apart in a longitudinal direction. For convenience, the first and second sides 20 and 22 will hereafter be referred to herein as front and back sides 20 and 22, with the longitudinal direction thereby being understood to be a fore-aft direction. The frame 18 preferably includes a main body 24 and vertically extending mounting rails or brackets 26. Members of corresponding pairs of the mounting brackets 26 are preferably spaced from each other in a lateral direction transverse to the fore-aft direction.

The electronic devices 14 preferably are each mounted to the frame 18. More particularly, each electronic device 14 is preferably mounted to at least one pair of mounting brackets 26 via any means known in the art. In the illustrated embodiment, each electronic device is provided with a pair of tabs 28 to aid in mounting, although alternative and/or additional mounting approaches are permissible. Among other things, for instance, shelves, alternatively oriented brackets, lips, differing mounting tabs, and so on might additionally or alternatively be provided.

Each electronic device 14 preferably presents an intake side 30 configured to receive air and/or another fluid therethrough for passage into the electronic device 14. (For convenience and clarity, flow through the electronic devices 14 herein will be discussed exclusively in terms of air. However, as will be readily understood by those of ordinary skill in the art, any one or more of a variety of fluids might additionally or alternatively be used.) Each electronic device 14 also preferably presents an outflow side 32 configured to release air having passed through the electronic device. For each electronic device 14, the intake side 30 preferably faces the front side 20 of the frame 18, whereas the outflow side 32 faces the back side 222. Alternate orientations fall within the scope of some aspects of the present invention, however, as do variations in orientation amongst the multiple electronic devices mounted to a given frame.

As will be readily understood by those of ordinary skill in the art, air passing through a given electronic device 14 from the intake side 30 to the outflow side 32 conventionally increases in temperature due at least in part to the generation of heat by components of the electronic device 14 and the convection of that heat by the air. That is, air prior to intake is cooler than air after outflow. The intake side 30 may thus also be referred to as a cold side 30 in comparison to the outflow side 32, which may be referred to as a hot side 32.

In some data center configurations, a plurality of data center rack assemblies 10 are arranged in rows to advantageously orient the hot and cold sides 30 and 32 of the electronic devices 14. For instance, consider left, middle, and right rows of data center rack assemblies 10. The racks 12 in the left row are each oriented such that the front sides 20 thereof face a first open space or aisle disposed to the right of the left row. The racks 12 in the middle row are disposed to the right of the first aisle and oriented such that their front sides 20 also face the first aisle. The intake sides 30 (or cold sides 30) of each electronic device 14 in the racks 12 of the left and middle rows are also likewise oriented toward the first aisle. That is, the first aisle is disposed between the cold sides 30 of the electronic devices 14 of the left and middle rows. The first aisle may thus be referred to as a "cold aisle." The outflow sides 32 (or hot sides 32) of the electronic devices 14 of the middle row face a second aisle, to the right of the middle row. The racks 12 of the right row are disposed to the right of the second aisle and oriented such that their back sides 22 face the second aisle. Thus, the outflow sides 32 (or hot sides 32) of the electronic devices 14 in the right row also face the second aisle. The second aisle may thus be referred to as a "hot aisle." Such an arrangement, which can of course be repeated throughout a given data center, facilitates improved thermal management within the center by, among other things, concentrating cooler air and hotter air in separate locations.

In some instances, an electronic device 14 might be mounted in such a manner that the intake side 30 thereof is flush with the front side 20 of the given rack 12, such that the intake side 30 is immediately adjacent any air passing thereby (e.g., cool air in a "cold aisle" as described above). However, in some circumstances, the electronic device 14 might be mounted to the frame 18 in such a manner than the intake side 30 is disposed intermediately between the front and rear rack sides 20 and 22. That is, the intake side 30 is spaced from the front side 20 such that a longitudinal dimension D is defined between the front side 20 and the intake side 30. In a functional sense, such spacing results in the intake side 30 being spaced from the air adjacent the front side 20. Absent any mitigation, the air entering the intake side 30, then, would be air from an intermediate position in the rack 12. As will be readily understood by those of ordinary skill in the art, such intermediate air may in some instances have already been disadvantageously warmed relative to the air adjacent the front side 20 of the rack 12. As will be discussed in greater detail below, the ducts 16 of the present invention address this deficiency.

Duct Overview

In a preferred embodiment, each duct 16 includes a body 34 including relatively shiftable proximal (front), intermediate (middle), and distal (rear) sections 36, 38, and 40, respectively, that are extendable in the longitudinal direction to cooperatively present an adjustable longitudinal duct length L. Broadly speaking, each duct 16 also preferably includes a drive mechanism 42 operably coupled to each of the sections 36, 38, and 40 to control relative shifting of the sections 36, 38, and 40 in the longitudinal direction and thereby adjust the longitudinal duct length L to correspond with the longitudinal dimension D.

As will be discussed in greater detail below, the drive mechanism 42 and the sections 36, 38, and 40 are preferably sized and configured such that the duct 16 is extendable from the front side 20 of the rack 12 all the way to the intake side 30 of the electronic device 14 in order to contact the intake side 30 of the electronic device 14. In such a configuration, the duct length L and the longitudinal dimension D are equal. As will be readily understood by those of ordinary skill in the art, in such a configuration, the duct 16 provides a complete path 44 for flow of air from the front side 20 of the rack 12 to the intake side 30.

Although three (3) sections 36, 38, and 40 are illustrated and described in a first preferred embodiment of the present invention, it is noted that more or fewer sections might be provided without departing from the scope of some aspects of the present invention.

In a preferred embodiment, the duct 16 further includes a perimetrically extending seal 46 configured to engage the intake side 30 of the electronic device 14 when the duct 16 extends from the first rack side 20 to the intake side 30 of the electronic device 14. The seal 46 is preferably a rubber grommet, although other materials and/or seal types might additionally or alternatively be used. Furthermore, the seal might in some embodiments be omitted entirely.

The duct 16 further preferably includes a plurality of support tabs 48 (e.g., a pair of side support tabs 48a and 48b and a central support tab 48c) configured to engage the electronic device 14, such that the duct 16 is at least in part supported by the electronic device 14 when the duct 16 extends from the first rack side 20 to the intake side 30 of the electronic device 14. More particularly, the support tabs 48 preferably project aftwardly from the distal section 40 and rest on an upper face 14a of the electronic device 14 when the duct 16 is extended as described above.

Still further, a pair of mounting tabs 50 preferably extend laterally outwardly from the proximal section 36. As best shown in FIG. 1, the mounting tabs 50 are preferably secured to the frame 18 (or, more specifically, to respectively ones of a pair of rails 26 thereof) to at least in part support the duct 16 on the frame 18.

Duct Body

The proximal or front section 36 of the duct body 34 preferably includes a top 36a, a bottom 36b, and sides 36c and 36d. The top 36a and the bottom 36b each extend between and connect the sides 36c and 36d. The top 36a and the bottom 36b are preferably congruent and rectangular in shape. The sides 36c and 36d are preferably congruent and rectangular in shape. The proximal section 36 (or, more specifically, the top, bottom, and sides 36a-d thereof) preferably presents a rectangular cross-section, with a lateral width being greater than a vertical height thereof. Variations in dimensions and/or shape fall within the scope of some aspects of the present invention, however.

The proximal section 36 preferably presents an outer surface 36e and an inner surface 36f, each cooperatively defined by the top, the bottom, and the sides 36a-d. The proximal section 36 also preferably presents a perimetrical front edge 36g and a perimetrical back edge 36h, each also cooperatively defined by the top, the bottom, and the sides 36a-d. The front edge 36g of the proximal section 36 is preferably flush with or nearly flush with the front side 20 of the rack 12. Alternative alignments (e.g., due to alternative mounting systems) fall within the scope of some aspects of the present invention, however.

The intermediate or middle section 38 of the duct body 34 preferably includes a top 38a, a bottom 38b, and sides 38c and 38d. The top 38a and the bottom 38b each extend between and connect the sides 38c and 38d. The top 38a and the bottom 38b are preferably congruent and rectangular in shape. The sides 38c and 38d are preferably congruent and rectangular in shape. The intermediate section 38 (or, more specifically, the top, bottom, and sides 38a-d thereof) preferably presents a rectangular cross-section, with a lateral width being greater than a vertical height thereof. Variations in dimensions and/or shape fall within the scope of some aspects of the present invention, however.

The intermediate section 38 preferably presents an outer surface 38e and an inner surface 38f, each cooperatively defined by the top, the bottom, and the sides 38a-d. The intermediate section 38 also preferably presents a perimetrical front edge 38g and a perimetrical back edge 38h, each also cooperatively defined by the top, the bottom, and the sides 38a-d.

The distal or rear section 40 of the duct body 34 preferably includes a top 40a, a bottom 40b, and sides 40c and 40d. The top 40a and the bottom 40b each extend between and connect the sides 40c and 40d. The top 40a and the bottom 40b are preferably congruent and rectangular in shape. The sides 40c and 40d are preferably congruent and rectangular in shape. The distal section 40 (or, more specifically, the top, bottom, and sides 40a-d thereof) preferably presents a rectangular cross-section, with a lateral width being greater than a vertical height thereof. Variations in dimensions and/or shape fall within the scope of some aspects of the present invention, however.

The distal section 40 preferably presents an outer surface 40e and an inner surface 40f, each cooperatively defined by the top, the bottom, and the sides 40a-d. The distal section 40 also preferably presents a perimetrical front edge 40g and a perimetrical back edge 40h, each also cooperatively defined by the top, the bottom, and the sides 40a-d.

As noted above, variations in dimensions and/or shape of the distal section 40 fall within the scope of some aspects of the present invention. However, it is most preferable that the cross-sectional shape and size of the distal section 40, particularly adjacent the back edge 40h, is complementary to the shape and size of the corresponding electronic device 14.

The proximal section 36 is preferably wider and taller than the intermediate section 38, which is in turn preferably wider and taller than the distal section 40, such that the distal section is at least in part collapsible into the intermediate section 38, which is in turn at least in part collapsible into the proximal section (the distal section 40 thereby also being at least in part collapsible into the proximal section). Sample preferred nominal dimensions will be provided below. Furthermore, in keeping with the above and as will be discussed in greater detail below, the sections 36, 38, and 40 may be understood to be telescoping sections.

Although complementarily sized rectangular sections 36, 38, and 40 as described above are most preferred, it is particularly noted that ducts having telescoping sections of other shapes (e.g., circular, square, or alternatively polygonal) fall within the scope of the present invention. Still further, although complementary sizes and shapes are necessary to facilitate telescoping capabilities, non-telescoping portions of the duct might be of any size or shape without departing from the scope of the present invention. Further still, it is permissible according to some aspects of the present invention for exterior and interior shapes defined by duct sections to be non-analogous. For instance, a section having a rectangular outer surface but a circular inner surface might receive a section having a circular outer surface and a rectangular inner surface, etc., without departing from the scope of some aspects of the present invention.

It is also noted that one or more of the top, bottom, and side walls of a given duct section might be omitted without departing from the scope of some aspects of the present invention. However, presence of all sides is preferred to facilitate efficient airflow.

Duct Configurations

Figure 2:
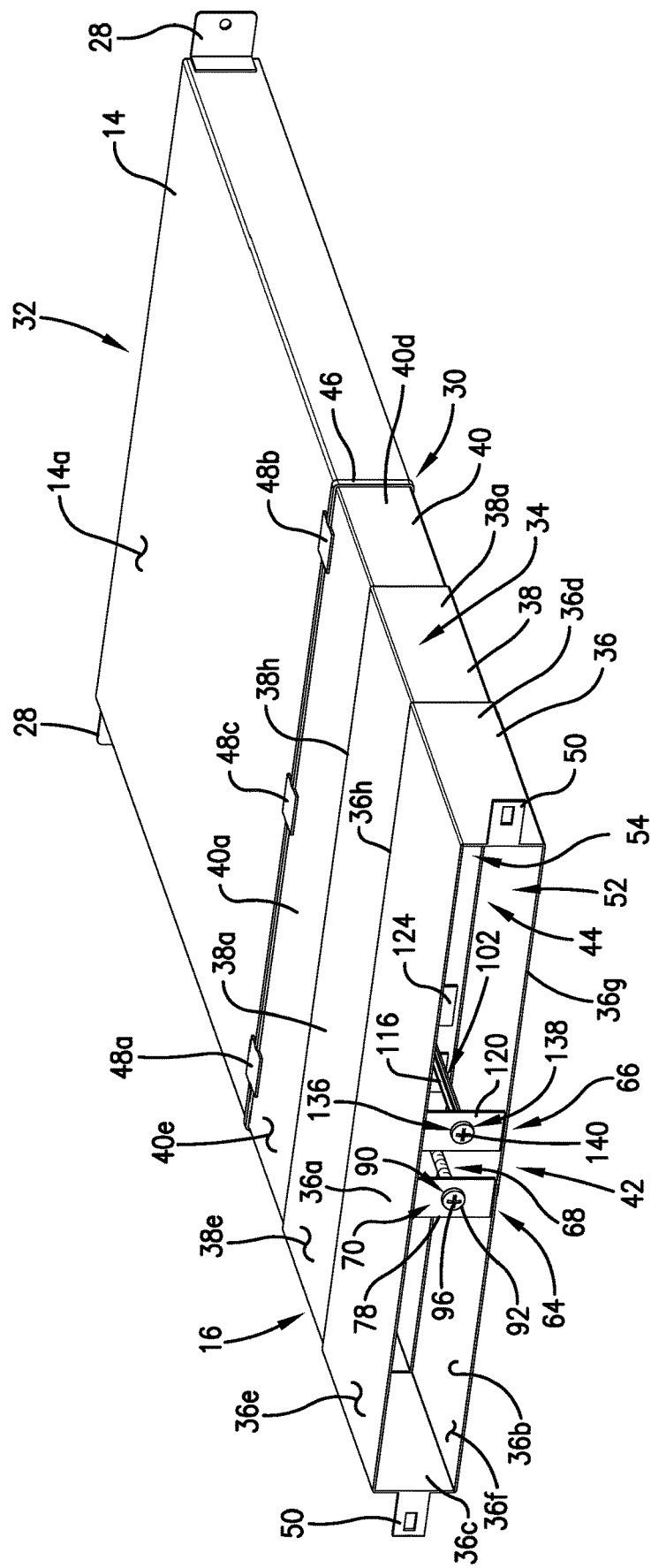
FIG. 2 is an enlarged, front perspective view of a single duct and electronic device of the assembly FIG. 1, with the duct in a partially expanded, engaged configuration.

The duct 16 (i.e., the body 34 thereof) is shiftable between a fully collapsed or contracted configuration (see FIG. 3 and others) and a fully expanded or extended configuration, with a continuum of intermediate or partially expanded configurations (see FIG. 2 and others) lying between. Preferably, one of the configurations, referred to herein as an engagement configuration, is such that the duct length L is equal to the longitudinal distance D from the front of the rack 12 to the intake side 30 of the electronic device 14 (again see FIG. 2 and others). That is, in the engagement configuration, the duct 16 provides a flow path for air from the front side 20 of the rack 12 to the intake side 30. It is particularly noted that, depending on the mounting position of the electronic device and the duct; the sizes of the electronic device, frame, and duct body; and other factors, the engagement configuration may be the same as the fully collapsed configuration, the fully expanded configuration, or one of the intermediate configurations. Most preferably, however, the duct 16 is designed in such a manner (i.e., with typical data center rack assembly and electronic device dimensions and configurations in mind) that the engagement configuration most typically corresponds with an intermediate configuration, as illustrated.

It is also noted that, in hypothetical embodiments of the present invention in which the front edge of the proximal section does not align with front side of the rack, the duct length L will not be equal to the previously defined longitudinal distance D when the duct is in a comparable "engaged configuration." In any design, however, the so-called "engaged configuration" should be understood as one in which the duct extends as completely as possible both toward the front of the rack (in the fore direction) and the intake side (in the aft direction).

Fully Collapsed Configuration

Figure 3:
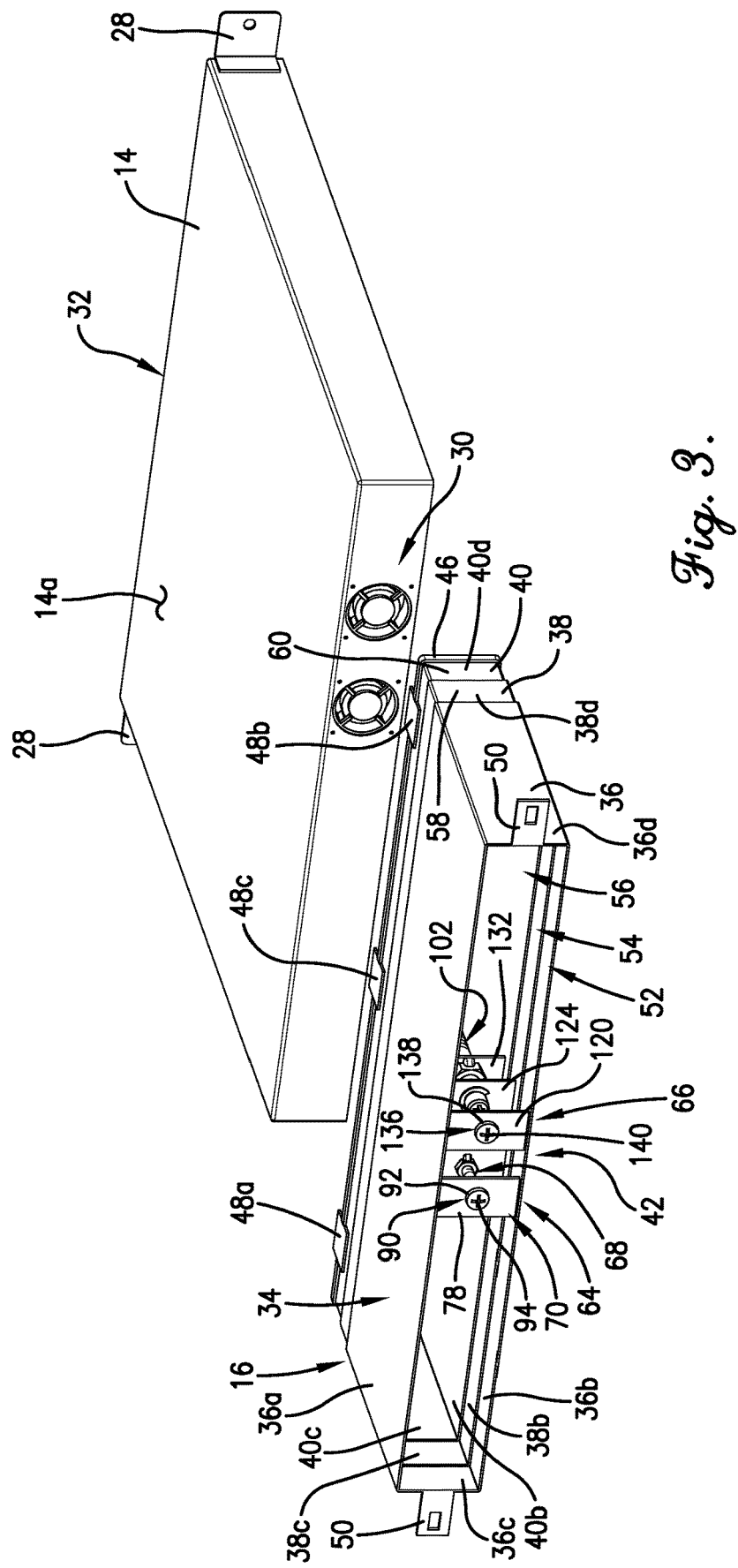
FIG. 3 is a front perspective view of the duct and electronic device of FIG. 2, with the duct in a fully collapsed configuration.
Figure 9:
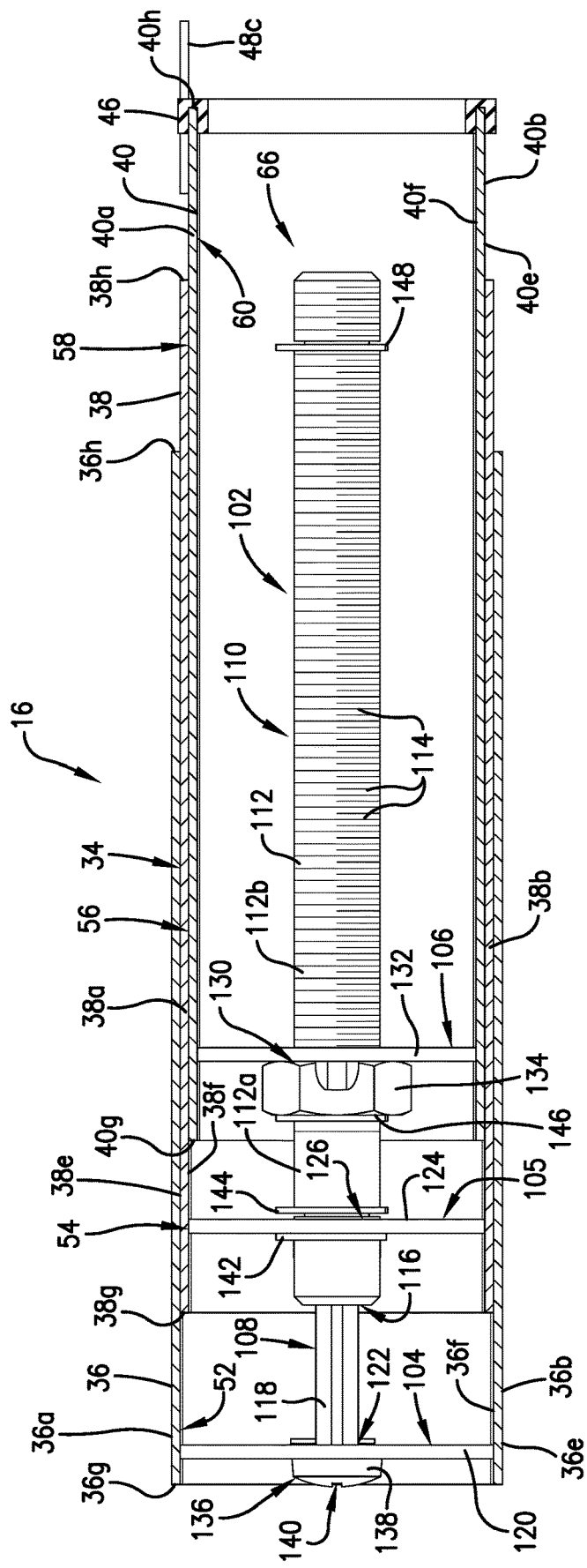
FIG. 9 is a cross-sectional side view of the duct of FIGS. 2-8 in the fully collapsed configuration.
Figure 10:
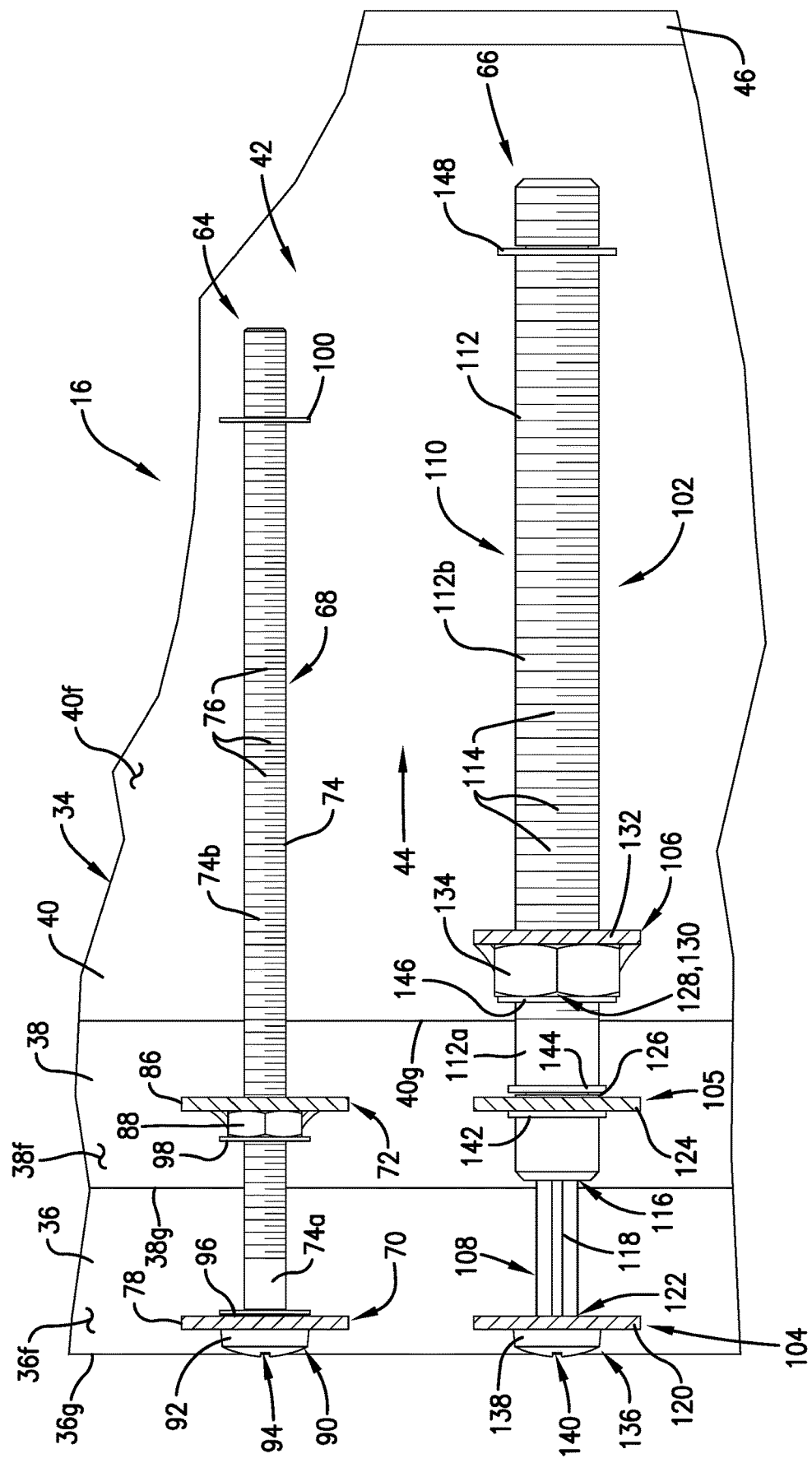
FIG. 10 is a cross-sectional top view of the duct similar to FIG. 8, but showing the duct in the fully collapsed configuration.

The fully collapsed configuration of the duct 16 is best shown in FIGS. 3, 9, and 10. In such a configuration, the front edges 36g, 38g, and 40g are sequentially staggered from one another in the fore-aft direction, as are the rear edges 36h, 38h, and 40h, with all of the front edges 36g, 38g, and 40g being disposed forward of all of the rear edges 36h, 38h, and 40h.

As best shown in FIG. 9, regions of proximal extension 52, proximal-intermediate overlap 54, proximal-intermediate-distal overlap 56, intermediate-distal overlap 58, and distal extension 60 are sequentially staggered in the fore-aft direction.

Of these regions, the proximal-intermediate-distal overlap 56 preferably presents the greatest longitudinal dimension, although alternative configurations fall within the scope of some aspects of the present invention.

The longitudinal dimensions of the proximal extension 52, the proximal-intermediate overlap 54, the intermediate-distal overlap 58, and the distal extension 60 are preferably at least substantially equal, although alternative configurations fall within the scope of some aspects of the present invention. Sample preferred nominal dimensions will be provided below.

Partially Expanded, Engaged Configuration

The partially expanded, engaged configuration of the duct 16 (corresponding, in the illustrated embodiment, to an almost fully expanded configuration of the duct 16) is best shown in FIGS. 2, 4, 5, 7, and 8. In such a configuration, the front edges 36g, 38g, and 40g are sequentially staggered from one another in the fore-aft direction, as are the rear edges 36h, 38h, and 40h. In contrast to the collapsed configuration, however, the rear edge 36h of the proximal section 36 is disposed forward of the front edge 40g of the distal section 40.

Figure 7:
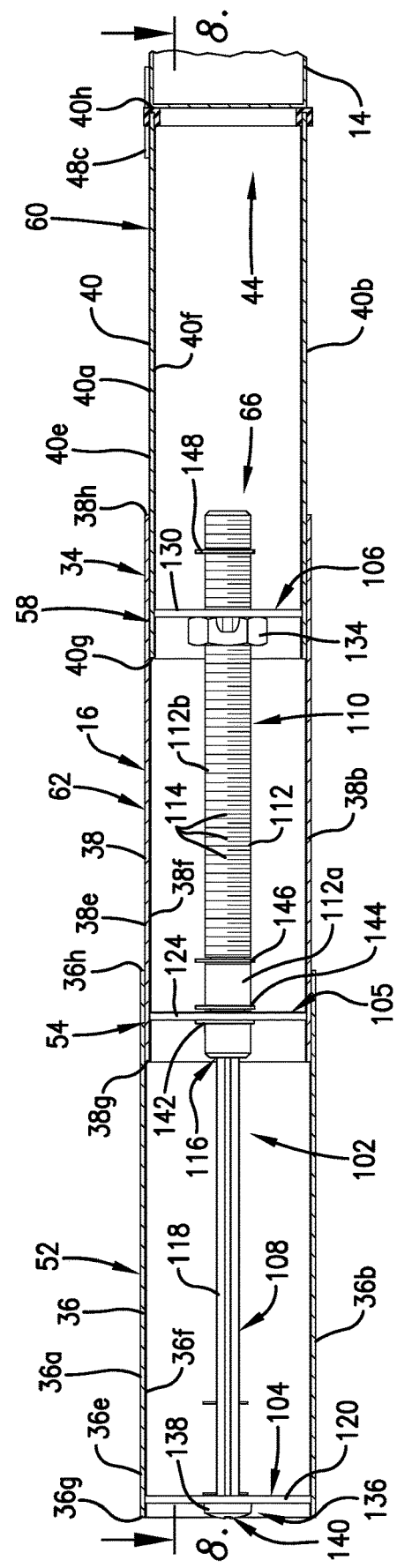
FIG. 7 is a side view, taken along line 7-7 of FIG. 6, of the duct of FIGS. 2-6 in the partially expanded, engaged configuration.
Figure 8:
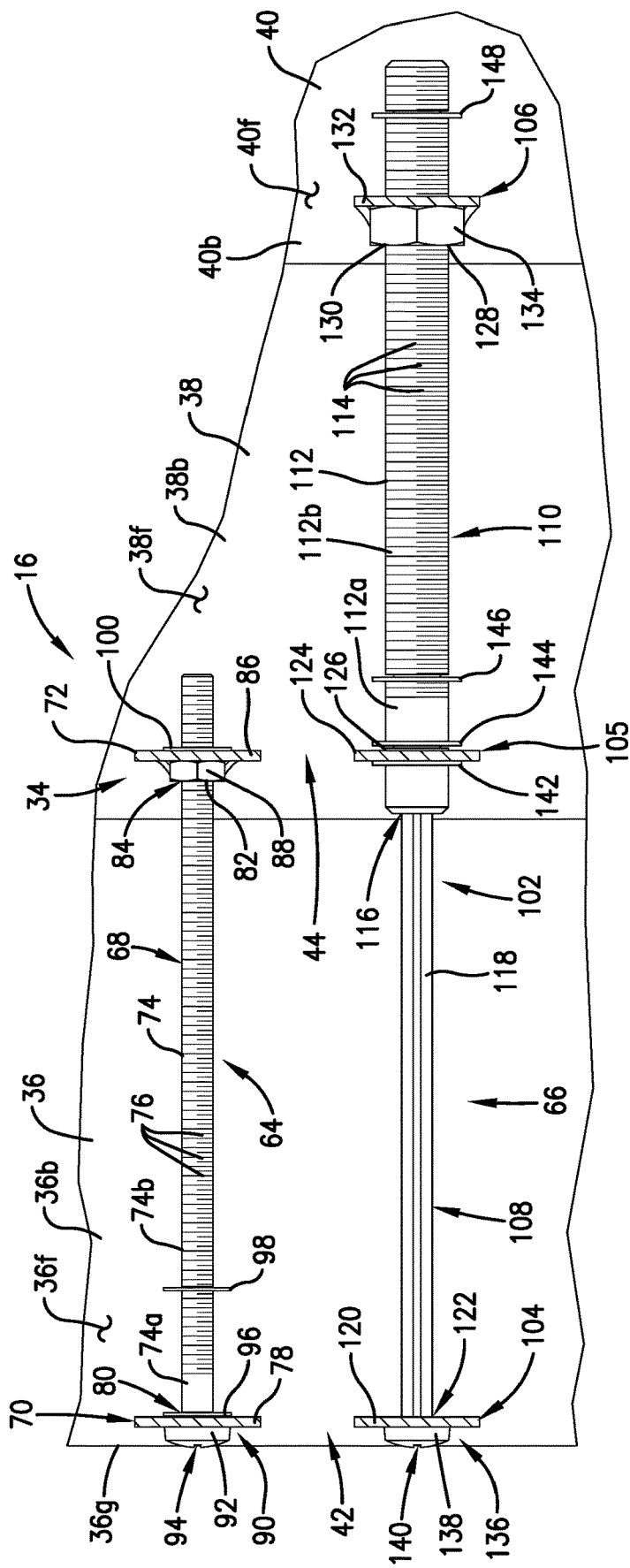
FIG. 8 is a cross-sectional top view, taken along line 8-8 of FIG. 7, of the duct of FIGS. 2-7 in the partially expanded, engaged configuration.

As best shown in FIG. 7, regions of proximal extension 52, proximal-intermediate overlap 54, intermediate extension 62 (not present in the fully collapsed configuration), intermediate-distal overlap 58, and distal extension 60 are sequentially staggered in the fore-aft direction.

Of these regions, the proximal extension 52 presents the greatest longitudinal dimension, followed by the distal extension 60 and then the region of intermediate extension 62. The longitudinal dimensions of the proximal-intermediate overlap 54 and the intermediate-distal overlap 58 are preferably smaller than those of each of the extensions 52, 60, and 62, with the proximal-intermediate overlap 54 being smaller than the intermediate-distal overlap 58 (in keeping with the longer proximal extension 52, as noted above, compared to the distal extension 60). The specific dimensions and relative magnitudes thereof will be dependent both on the degree to which the duct 16 is extended and to the specific sequence by which the sections 36, 38, and 40 were shifted. For instance, the same total duct length L as illustrated in FIG. 7 could be achieved by a process in which the distal section was fully telescoped out from the intermediate section, but the intermediate section was not fully telescoped from the proximal section. Sample preferred nominal dimensions will be provided below.

Dimensions

In a preferred embodiment, as illustrated, the duct 16 is sized and configured for use with a standard nineteen (19) inch rack 12.

More particularly, the sections 36, 38, and 40 each present a longitudinal length of six (6) inches. The sections 36, 38, and 40 cooperatively present a maximum, fully expanded duct body length L of sixteen (16) inches through the provision of one (1) inch long proximal-intermediate and intermediate-distal overlaps 54 and 58, respectively, which results in a five (5) inch long proximal extension 52, a four (4) inch long intermediate extension, and a five (5) inch long distal extension.

In contrast, the duct sections 36, 38, and 40 are configured to cooperatively present a minimum, fully contracted duct body length L of eight (8) inches, with a one (1) inch proximal extension 52, proximal-intermediate overlap 54, intermediate-distal overlap 58, and distal extension 60, combined with a four (4) inch proximal-intermediate-distal overlap 56.

The proximal section 36 preferably presents a lateral width of about seventeen and three thousand, one hundred twenty-five ten thousandths (17.3125) inches and a vertical height of about one and seventy-two hundredths (1.72) inches.

The intermediate section 38 preferably presents a slightly smaller lateral width of about seventeen and one thousand, eight hundred seventy-five ten thousandths (17.1875) inches and a slightly smaller vertical height of about one and sixty-eight hundredths (1.68) inches.

The distal section 40 preferably presents a still smaller lateral width of about seventeen and six hundred twenty-five ten thousandths (17.0625) inches and a still smaller vertical height of about one and sixty-four hundredths (1.64) inches.

Although the above dimensions are most preferred for the data center application described herein, it is noted that the principles of the present invention are broadly applicable to duct bodies having both nominally varying dimensions and relationally varying dimensions. For instance, the duct body might be substantially larger while maintaining similar proportional relationships, be substantially smaller and present entirely different proportions, etc.

Drive Mechanism Structure

As noted previously, each duct 16 preferably includes a drive mechanism 42 operably coupled to each of the sections 36, 38, and 40 to control relative shifting of the sections 36, 38, and 40 in the longitudinal direction (e.g., between the aforementioned collapsed and expanded states and any to any desired intermediate states). The drive mechanism 42 preferably includes first and second drive assemblies 64 and 66, respectively.

First Drive Assembly

The first drive assembly 64 includes a fixed rod 68, a proximal fixed rod support 70, and a distal fixed rod support 72. The fixed rod 68 preferably includes a body 74 having a proximal smooth (i.e., non-threaded) portion 74a and a distal threaded portion 74b that defines external threads 76.

The proximal fixed rod support 70 preferably comprises a tab 78 defining a smooth (i.e., non-threaded) opening 80 therethrough.

In contrast, the distal fixed rod support 72 preferably has internal threads 82 defining an internally threaded opening 84. More particularly, the distal fixed rod support 72 preferably comprises a tab 86 and a nut 88 welded or otherwise fixed to the tab 86 (e.g., via glues or adhesives, integral formation, latches, fasteners, etc.). The nut 88 defines the internal threads 82 and the threaded opening 84 therethrough. Other configurations of the distal fixed rod support are permissible, however, including but not limited to those in which a thickened tab self-defines the threaded opening.

The proximal tab 78 preferably extends between and is fixed to the top and bottom 36a and 36b of the proximal section 36, immediately adjacent or near to the front edge 36g thereof. The distal tab 86 preferably extends between and is fixed to the top and bottom 38a and 38b of the intermediate section 38, near to the front edge 38g thereof. Some variations in positioning fall within the scope of some aspects of the present invention. However, as will become apparent below, the illustrated positioning facilitates an advantageous range of expansion and contraction of the duct 16.

The fixed rod 68 extends through each of the openings 80 and 84 so as to be supported by the tabs 78 and 86. More particularly, the proximal smooth portion 74a extends through the smooth opening 80, and the threaded portion 74b extends through the threaded opening 84, with the external threads 76 of the threaded portion 74b engaging the internal threads 82 defining the threaded opening 84.

The fixed rod 68 preferably has a proximal access end 90 disposed forward of and most preferably in contact with the proximal tab 78. The access end 90 is thus preferably at least substantially in line with the front edge 36g of the proximal section 36.

More particularly, the fixed rod 68 preferably includes a head 92 defining the access end 90. The head 92 preferably defines a tool-receiving recess 94 configured to receive at least a portion of a rotatable tool (not shown). Rotation of the tool when at least a portion thereof is received in the tool-receiving recess 94 preferably results in rotation of the fixed rod 68.

As will be discussed in greater detail below, rotation of the fixed rod 68 results in longitudinal shifting of the fixed rod 68 through the threaded opening 84 and relative to the distal tab 86. Such relative shifting is manifested by shifting of the proximal and intermediate duct sections 36 and 38, respectively, relative to each other. That is, rotation of the fixed rod 68 results in longitudinal travel of the distal tab 86 and, in turn, the intermediate section 38, along the threaded portion 74b of the fixed rod 68 (and therefore into or out of the proximal section 36).

As will also be discussed in greater detail below, the drive mechanism 42 is preferably configured such that shifting of the intermediate section 38 as a result of rotation of the fixed rod 68 is accompanied by at least substantially equal shifting of the distal section 40. That is, rotation of the fixed rod 68 preferably does not result in relative shifting between the intermediate section 38 and the distal section 40, with the distal section 40 instead "following along" with motion of the intermediate section 38.

In a preferred embodiment, the fixed rod 68 is in the form of a threaded bolt, with the tool-receiving recess 94 being of a standardized configuration to facilitate driving by power tools well known by those of ordinary skill in the art. For instance, in the illustrated embodiment, the fixed rod 68 is a standard quarter (¼) inch bolt, and the tool-receiving recess 84 is in the form of a pair of intersecting troughs (i.e., an "X" or cross) to facilitate receipt of a conventional tool such as a cordless electric screwdriver having a Phillips-head tip.

In the illustrated preferred embodiment, a retaining clip 96 is disposed on the fixed rod 68 rearward of and preferably in contact with the proximal tab 78, such that the tab 78 and the fixed rod 68 are fixed relative to one another in the longitudinal direction. The retaining clip 96 prevents "backing out" of the fixed rod 68 through the tab 78 and may be in the form of an E-clip (as illustrated), a C-clip, or another comparably functional structure (including structures not conventionally categorized as "clips").

Figure 4:
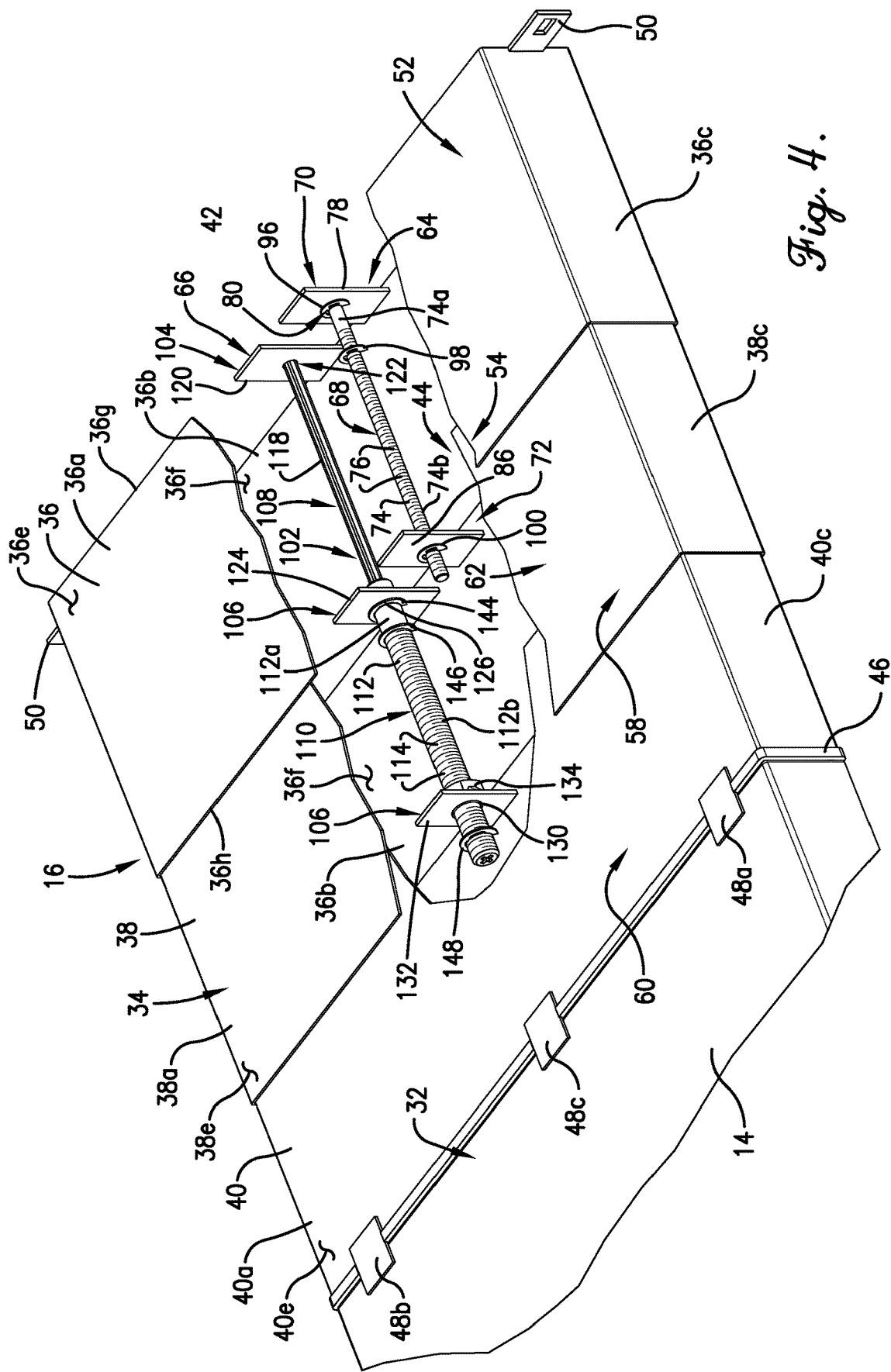
FIG. 4 is an enlarged, partially fragmented rear perspective view of the duct and a portion of the electronic device of FIGS. 2 and 3, with the duct in the partially expanded, engaged configuration.
Figure 5:
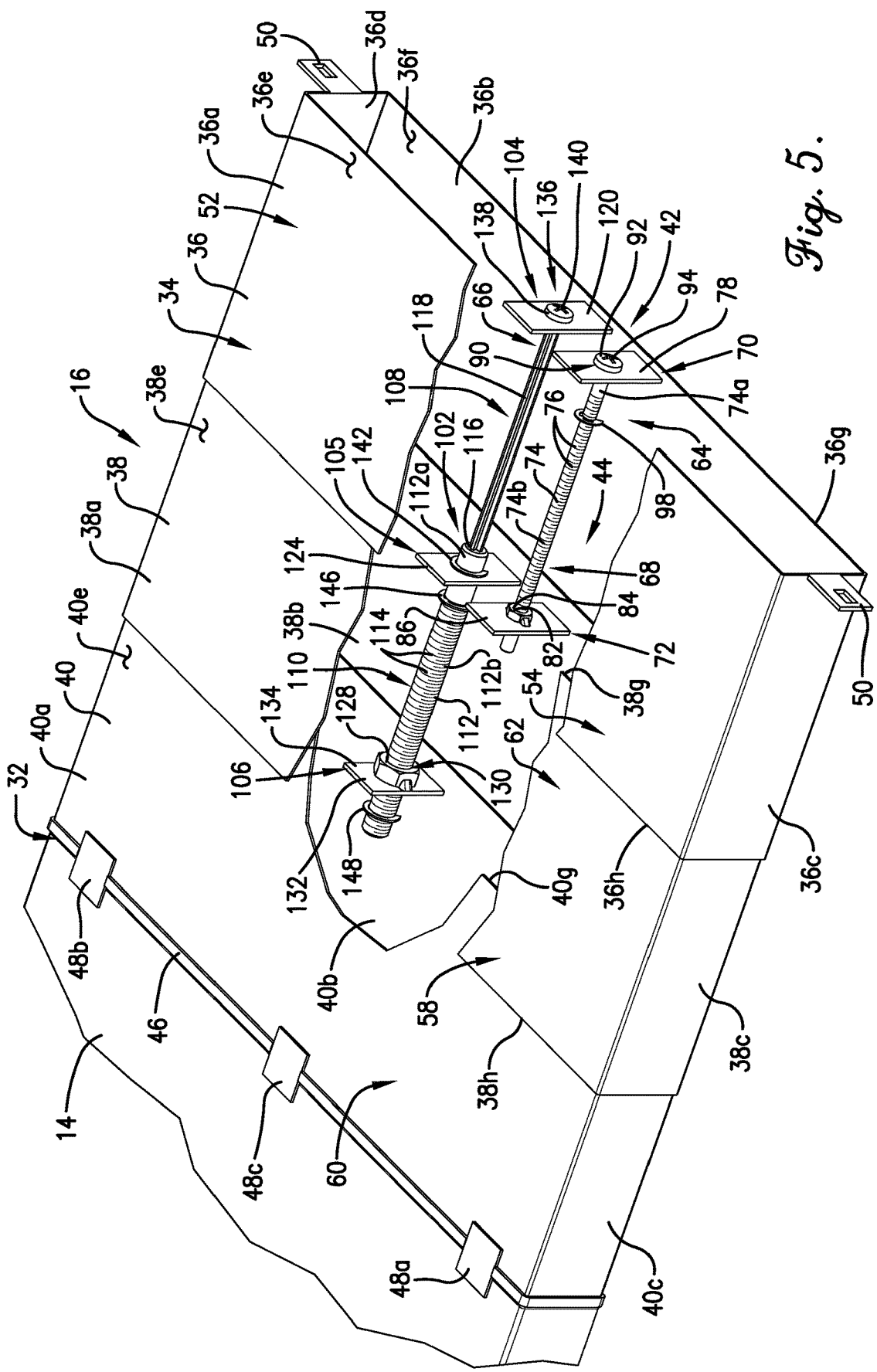
FIG. 5 is a front perspective view of the partially fragmented duct and electronic device portion as shown in FIG. 4.
Figure 6:
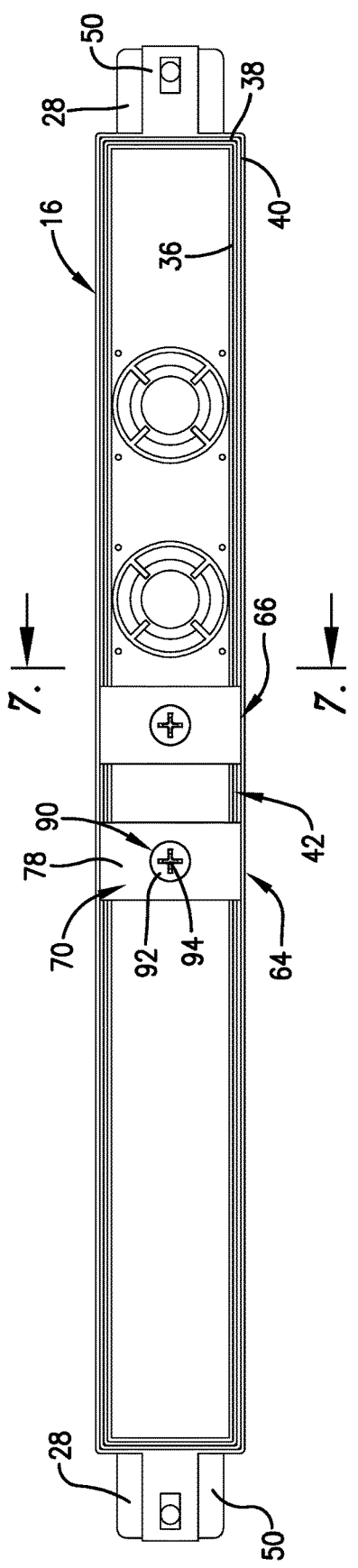
FIG. 6 is a front view of the duct of FIGS. 2-5.

As will be discussed in greater detail below, contraction and extension control clips 98 and 100, respectively, are disposed at or near respective fore and aft ends of the threaded portion 74b. As shown in FIG. 10 and others, the contraction control clip 98 provides a physical barrier against excessive contraction of the intermediate section 38 into the proximal section 36 via engagement of the contraction control clip 98 and the nut 88. As shown in FIG. 4 and others, the extension control clip 100 provides a physical barrier against excessive expansion of the intermediate section 38 out of the proximal section 36 via engagement of the extension control clip 100 and the distal tab 88. Either or both of the clips 98 and 100 may be in the form of an E-clip (as illustrated), a C-clip, or another structure (including structures not conventionally categorized as "clips") comparably functional to restrict excessive extension or collapse.

It is particularly noted that, in some embodiments, the contraction and extension control clips might be omitted entirely. Still further, variation(s) in position or dimensions/structure (particularly in the fore-aft direction) may be made to modify the extent of allowable extension or contraction. Alternatively stated, it is permissible according to some aspects of the present invention for the contraction control clip to be repositioned or re-dimensioned/re-structured to adjust the minimum dimension of the proximal extension, as at full contraction. Similarly, it is permissible according to some aspects of the present invention for the extension control clip to be repositioned or re-dimensioned/re-structured to adjust the minimum dimension of the proximal-intermediate overlap, as at full extension.

It is also permissible for additional for alternative means for restricting over-extension or over-collapse to be provided. For instance, lips or other stops might instead be formed on the duct sections themselves.

Second Drive Assembly

The second drive assembly 66 includes an extendable rod 102, a proximal extendable rod support 104, an intermediate extendable rod support 105, and a distal extendable rod support 106. The extendable rod 102 preferably includes a rail portion 108 and a traveling portion 110.

The traveling portion 110 preferably includes a body 112 having a proximal smooth (i.e., non-threaded) portion 112a and a distal threaded portion 112b that defines external threads 114. The body 112 of the traveling portion 110 preferably defines a longitudinally extending rail-receiving channel or lumen 116 extending longitudinally therethrough. The channel 116 preferably extends through the entirety of the body 112, although partial extension falls within the scope of some aspects of the present invention.

The rail portion 108 preferably comprises a longitudinally extending body 118 sized and shaped to at least in part be securely slidably received in the channel 116 without being rotatable therein. In the illustrated embodiment, for instance, the rail portion 108 presents an X-shaped or cross-shaped cross-sectional shape. The channel 116 likewise preferably presents an X-shaped or cross-shaped cross-sectional shape. The channel 116 is sized to facilitate a tight or slightly loose fit of the body 118 of the rail portion 108 therein, such that rotation of the rail portion 108 results in corresponding rotation of the body 112 of the traveling portion 110, but longitudinal shifting of the rail portion 108 within the channel 116 (i.e., relative to the body 112 of the traveling portion 110) is facilitated. Alternatively stated, the traveling portion 110 is longitudinally shiftable along the rail portion 108 but rotatably fixed relative thereto.

It is noted that alternative rail portion and channel shapes that provide this "keyed" relationship are permissible, as well.

The proximal extendable rod support 104 preferably comprises a tab 120 defining a smooth (i.e., non-threaded) opening 122 therethrough.

The intermediate extendable rod support 105 likewise preferably comprises a tab 124 defining a smooth (i.e., non-threaded) opening 126 therethrough.

In contrast, the distal extendable rod support 106 preferably has internal threads 128 defining an internally threaded opening 130. More particularly, the distal extendable rod support 106 preferably comprises a tab 132 and a nut 134 welded or otherwise fixed to the tab 132 (e.g., via glues or adhesives, integral formation, latches, fasteners, etc.). The nut 134 defines the internal threads 128 and the threaded opening 130 therethrough. Other configurations of the distal extendable rod support are permissible, however, including but not limited to those in which a thickened tab self-defines the threaded opening.

The proximal tab 120 preferably extends between and is fixed to the top and bottom 36a and 36b of the proximal section 36, immediately adjacent or near to the front edge 36g thereof. The intermediate tab 124 preferably extends between and is fixed to the top and bottom 38a and 38b of the intermediate section 38, immediately adjacent or near to the front edge 38g thereof. The distal tab 132 preferably extends between and is fixed to the top and bottom 40a and 40b of the distal section 40, immediately adjacent or near to the front edge 40g thereof. Some variations in positioning fall within the scope of some aspects of the present invention. However, as will become apparent below, the illustrated positioning facilitates an advantageous range of expansion and contraction of the duct 16.

The extendable rod 102 extends through each of the openings 122, 126, and 130 as to be supported by the tabs 120, 124, and 132. More particularly, the rail portion 108 extends through the smooth opening 122 of the proximal extendable rod support 104, the proximal smooth portion 112a of the traveling portion 110 extends through the smooth opening 126 of the intermediate extendable rod support 105, and the threaded portion 112b of the traveling portion 110 extends through the threaded opening 130 of the distal extendable rod support 106, with the external threads 114 of the threaded portion 112b engaging the internal threads 128 defining the threaded opening 130.

The extendable rod 102 and, more particularly, the rail portion 108 thereof, preferably has a proximal access end 136 disposed forward of and most preferably in contact with the proximal tab 120. The access end 136 is thus preferably at least substantially in line with the front edge 36g of the proximal section 36.

More particularly, the rail portion 108 preferably includes a head 138 defining the access end 136. The head 138 preferably defines a tool-receiving recess 140 configured to receive at least a portion of a rotatable tool (not shown). Rotation of the tool when at least a portion thereof is received in the tool-receiving recess 140 preferably results in rotation of the extendable rod 102.

As will be discussed in greater detail below, rotation of the extendable rod 102 results in longitudinal shifting of the traveling portion 110 through the threaded opening 130 and relative to the distal tab 132. Such relative shifting is manifested by shifting of the intermediate and distal duct sections 38 and 40, respectively, relative to each other. That is, rotation of the rod 102 results in longitudinal travel of the distal tab 132 and, in turn, the distal section 40, along the threaded portion 112b of the traveling portion 110 of the extendable rod 102 (and therefore into or out of the intermediate section 38).

As briefly noted above and as will be discussed in greater detail below, the drive mechanism 42 is preferably configured such that shifting of the intermediate section 38 as a result of rotation of the fixed rod 68 is accompanied by at least substantially equal shifting of the distal section 40. This is facilitated by "following along" of the traveling portion 110 along the rail portion 108 and, in turn, "following along" of the distal section 40.

In a preferred embodiment, the tool-receiving recess 140 is of a standardized configuration to facilitate driving by power tools well known by those of ordinary skill in the art. For instance, in the illustrated embodiment, the tool-receiving recess 140 is in the form of a pair of intersecting troughs (i.e., an "X" or cross) to facilitate receipt of a conventional tool such as a cordless electric screwdriver having a Phillips-head tip. Most preferably, the tool-receiving recesses 94 and 140 are identical to each other to facilitate driving of both the first and second drive assemblies 64 and 66 using a single tool.

In the illustrated preferred embodiment, a first retaining clip 142 is disposed on the proximal smooth portion 112a of the traveling portion 110 of the extendable rod 102, forward of and preferably in contact with the intermediate tab 124. A second retaining clip 144 is disposed on the proximal smooth portion 112a of the traveling portion 110 of the extendable rod 102, rearward of and preferably in contact with the intermediate tab 124. The intermediate tab 124 and the traveling portion 110 are thus fixed relative to one another in the longitudinal direction. The retaining clips 142 and 144 prevent "backing out" or "backing through" of the traveling portion 110 through the intermediate tab 124 and may either or both be in the form of an E-clip (as illustrated), a C-clip, or another comparably functional structure (including structures not conventionally categorized as "clips").

As will be discussed in greater detail below, contraction and extension control clips 146 and 148, respectively, are disposed at or near respective fore and aft ends of the threaded portion 112*b*. As shown in FIG. 10 and others, the contraction control clip 146 provides a physical barrier against excessive contraction of the distal section 40 into the intermediate section 38 via engagement of the contraction control clip 146 and the nut 134. As shown in FIG. 4 and others, the extension control clip 148 is configured to provide a physical barrier against excessive expansion of the distal section 40 out of the proximal section 38 via engagement of the extension control clip 148 and the distal tab 132. Either or both of the clips 146 and 148 may be in the form of an E-clip (as illustrated), a C-clip, or another structure (including structures not conventionally categorized as "clips") comparably functional to restrict excessive extension or collapse.

It is particularly noted that, in some embodiments, the contraction and extension control clips might be omitted entirely. Still further, variation(s) in position or dimensions/structure (particularly in the fore-aft direction) may be made to modify the extent of allowable extension or contraction. Alternatively stated, it is permissible according to some aspects of the present invention for the contraction control clip to be repositioned or re-dimensioned/re-structured to adjust the minimum dimension of the intermediate extension, as at full contraction. Similarly, it is permissible according to some aspects of the present invention for the extension control clip to be repositioned or re-dimensioned/re-structured to adjust the minimum dimension of the intermediate-distal overlap, as at full extension.

It is also permissible for additional for alternative means for restricting over-extension or over-collapse to be provided. For instance, lips or other stops might instead be formed on the duct sections themselves.

Preferably, the second drive assembly 66 is disposed laterally adjacent the first drive assembly 64, with the rail portion 108 and the traveling portion 110 extending parallel to the fixed rod 68. Furthermore, the drive assemblies 64 and 66 are collectively preferably disposed at least substantially centrally in the lateral direction between the sides 36*c* and 36*d*, the sides 38*c* and 38*d*, and the sides 40*c* and 40*d* of the respective duct sections 36, 38, and 40. It is permissible according to some aspects of the present invention, however, for alternative configurations to be used. For instance, the first drive assembly 64 might be disposed adjacent the sides 36*c*, 38*c*, and 40*c*, and the second drive assembly 66 might be disposed laterally opposite the first drive assembly 64 so as to be adjacent the sides 36*d*, 38*d*, and 40*d*.

Drive Mechanism Operation

As will be apparent from the above, the drive mechanism 42 in a broad sense can be described as including at least one rod 68 or 102, with rotation of the rod 68 or 102 resulting in longitudinal shifting of the selected rod 68 or 102 relative to at least one of the sections 36, 38, and 40 and consequent longitudinal shifting of at least two (2) of the sections 36, 38, and 40 relative to one another. Several example methods by which such shifting can be achieved are described in detail below. As will be readily understood by those of ordinary skill in the art, however, shifting sequences are inherently infinite due to the provision of two separately operable drive assemblies 64 and 66.

As will also be readily understood by those of ordinary skill in the art, the sample methods below are broadly applicable to duct assemblies having an initial intermediately expanded state, as well as those having the fully collapsed or fully expanded initial states as used in the examples.

It is also noted that, in certain circumstances, the relative positions of the sections 36, 38, and 40 might be such that at least one of the drive assemblies 64 or 66 is incapable of driving further collapse or further expansion. Alternatively stated, each drive assembly 64 or 66 is limited in its operability and in some circumstances may be unnecessary for or even unable to contribute to a given expansion or contraction goal.

Expansion—Sample Method 1

In a first method of expansion, beginning with the duct 16 in the fully collapsed state, the fixed rod 68 of the first drive assembly 64 is rotated counterclockwise by means of a power tool (not shown) having a tip received in the tool-receiving recess 94 of the access end 90. This rotation results in rearward longitudinal shifting of the distal fixed rod support 72 along the threaded portion 74*b* of the rod 68. The distal fixed rod support 72 is fixed to the intermediate section 38 of the duct 16, so the intermediate section 38 shifts rearward relative to the proximal section 36. That is, the intermediate section 38 expands rearward/outward from the proximal section 36. The distal section 40 passively shifts outwardly concurrently with and equally to the intermediate section 38 because (1) the traveling portion 110 of the second drive assembly 66 is longitudinally slidable along the rail portion 108; (2) the intermediate extendable rod support 105 is fixed to the intermediate section 38 and fixed longitudinally relative to the traveling portion 110, so that the traveling portion 110 moves longitudinally in concert with the intermediate section 38; (3) the distal extendable rod support 106 is fixed to the distal section 40; and (4) the distal extendable rod support is longitudinally fixed relative to the traveling portion 110 absent relative rotational motion therebetween. Thus, at completion of the above-described step, the intermediate section 38 has telescoped outward from the proximal section 36, but the distal section 40 remains nested within the intermediate section 38.

Next, the extendable rod 102 of the second drive assembly 66 is rotated counterclockwise by means of the same power tool (not shown) having its tip received in the tool-receiving recess 140 of the access end 136. This rotation results in rearward longitudinal shifting of the distal fixed rod support 72 along the threaded portion 112*b* of the traveling portion 110. The distal fixed rod support 72 is fixed to the distal section 40 of the duct 16, so the distal section 40 shifts rearward relative to the intermediate section 38. That is, the distal section 40 expands rearward/outward from the intermediate section 38. Thus, at completion of the above-described step, the intermediate section 38 has telescoped outward from the proximal section 36, and the distal section 40 has telescoped outward from the intermediate section 38.

Expansion—Sample Method 2

In an alternative method of expansion, also beginning with the duct 16 in the fully collapsed state, the extendable rod 102 of the second drive assembly 66 is instead rotated first. More particularly, the extendable rod 102 is rotated counterclockwise by means of a power tool (not shown) having a tip received in the tool-receiving recess 140 of the access end 136. This rotation results in rearward longitudinal shifting of the distal fixed rod support 72 along the threaded portion 112*b* of the traveling portion 110. The distal fixed rod support 72 is fixed to the distal section 40 of the duct 16, so the distal section 40 shifts rearward relative to the intermediate section 38. That is, the distal section 40 expands rearward/outward from the intermediate section 38.

The intermediate section 38 and the proximal section 36 remain in their original positions.

Next, the fixed rod 68 of the first drive assembly 64 is rotated counterclockwise by means of the same power tool (not shown) having its tip received in the tool-receiving recess 94 of the access end 90. This rotation results in rearward longitudinal shifting of the distal fixed rod support 72 along the threaded portion 74*b* of the rod 68. The distal fixed rod support 72 is fixed to the intermediate section 38 of the duct 16, so the intermediate section 38 shifts rearward relative to the proximal section 36. That is, the intermediate section 38 expands rearward/outward from the proximal section 36. The distal section 40 passively shifts further outwardly concurrently with and equally to the intermediate section 38 for the reasons noted above with regard to the first sample method of expansion.

Contraction—Sample Method 1

In a first method of contraction or collapse, beginning with the duct 16 in the fully expanded state, the fixed rod 68 of the first drive assembly 64 is rotated clockwise by means of a power tool (not shown) having a tip received in the tool-receiving recess 94 of the access end 90. This rotation results in forward longitudinal shifting of the distal fixed rod support 72 along the threaded portion 74*b* of the rod 68. The distal fixed rod support 72 is fixed to the intermediate section 38 of the duct 16, so the intermediate section 38 shifts forward relative to the proximal section 36. That is, the intermediate section 38 contracts forward/inward into the proximal section 36. The distal section 40 passively shifts inwardly concurrently with and equally to the intermediate section 38, for the reasons discussed previously with regard to the first sample method of expansion. Thus, at completion of the above-described step, the intermediate section 38 has collapsed inward into the proximal section 36, but the distal section 40 remains in its extended position relative to the intermediate section 38.

Next, the extendable rod 102 of the second drive assembly 66 is rotated clockwise by means of the same power tool (not shown) having its tip received in the tool-receiving recess 140 of the access end 136. This rotation results in forward longitudinal shifting of the distal fixed rod support 72 along the threaded portion 112*b* of the traveling portion 110. The distal fixed rod support 72 is fixed to the distal section 40 of the duct 16, so the distal section 40 shifts forward relative to the intermediate section 38 (and, in turn, the proximal section 36). That is, the distal section 40 contracts forward/inward into the intermediate section 38. Thus, at completion of the above-described step, the distal section 40 has nested into the intermediate section 38, which in turn has nested into the proximal section 36.

Contraction—Sample Method 2

In an alternative method of contraction, also beginning with the duct 16 in the fully expanded state, the extendable rod 102 of the second drive assembly 66 is instead rotated first. More particularly, the extendable rod 102 is rotated clockwise by means of a power tool (not shown) having a tip received in the tool-receiving recess 140 of the access end 136. This rotation results in forward longitudinal shifting of the distal fixed rod support 72 along the threaded portion 112*b* of the traveling portion 110. The distal fixed rod support 72 is fixed to the distal section 40 of the duct 16, so the distal section 40 shifts forward relative to the intermediate section 38. That is, the distal section 40 contracts forward/inward into the intermediate section 38. The intermediate section 38 and the proximal section 36 remain in their original positions.

Next, the fixed rod 68 of the first drive assembly 64 is rotated clockwise by means of the same power tool (not shown) having its tip received in the tool-receiving recess 94 of the access end 90. This rotation results in forward longitudinal shifting of the distal fixed rod support 72 along the threaded portion 74*b* of the rod 68. The distal fixed rod support 72 is fixed to the intermediate section 38 of the duct 16, so the intermediate section 38 shifts forward relative to the proximal section 36. That is, the intermediate section 38 collapses forward/inward into the proximal section 36. The distal section 40 passively shifts further inwardly concurrently with and equally to the intermediate section 38 for the reasons noted above with regard to the first sample method of expansion. Thus, at completion of the above-described step, the distal section 40 has nested into the intermediate section 38, which in turn has nested into the proximal section 36.

Design and Method Modifications and Influences

It is noted that a variety of factors may influence the exact movements that occur during the course of expansion or contraction. That is, numerous variations from the above-described preferred methods fall within the scope of the present invention.

For instance, variations in fit between the duct sections 36, 38, and 40; variations in tightness of fit of the rail portion 108 within the channel 116; and the precision of the various threads 76, 82, 114, and 128 may influence whether the sections 36, 38, and 40 each move only as described above or instead experience supplementary shifting. Alternatively stated, careful modification of design parameters to "bias" the motions of the sections 36, 38, and 40 is permissible. Unintentional variations in motion also may result from structures and/or methods nevertheless falling under the scope of the present invention.

Reversal of some or all thread directions is also permissible, such that rotational directions (i.e., clockwise vs. counterclockwise) must be reversed to result in expansion or contraction.

It is also permissible according to some aspects of the present invention for thread pitches to be selected to achieve a desired proportionality between rotation and longitudinal shifting. In one contemplated embodiment, for instance, one of the drive mechanisms might be provided with a different thread pitch than the other, such that one drive mechanism is optimized for gross (large) extension and the other drive mechanism is optimized for fine (small) extension.

In still another permissible modification, the drive assemblies might be linked to one another such that only one access end is provided, with rotation of a tool received therein resulting in rotation of both the fixed and extendable rods.

Figure 11:
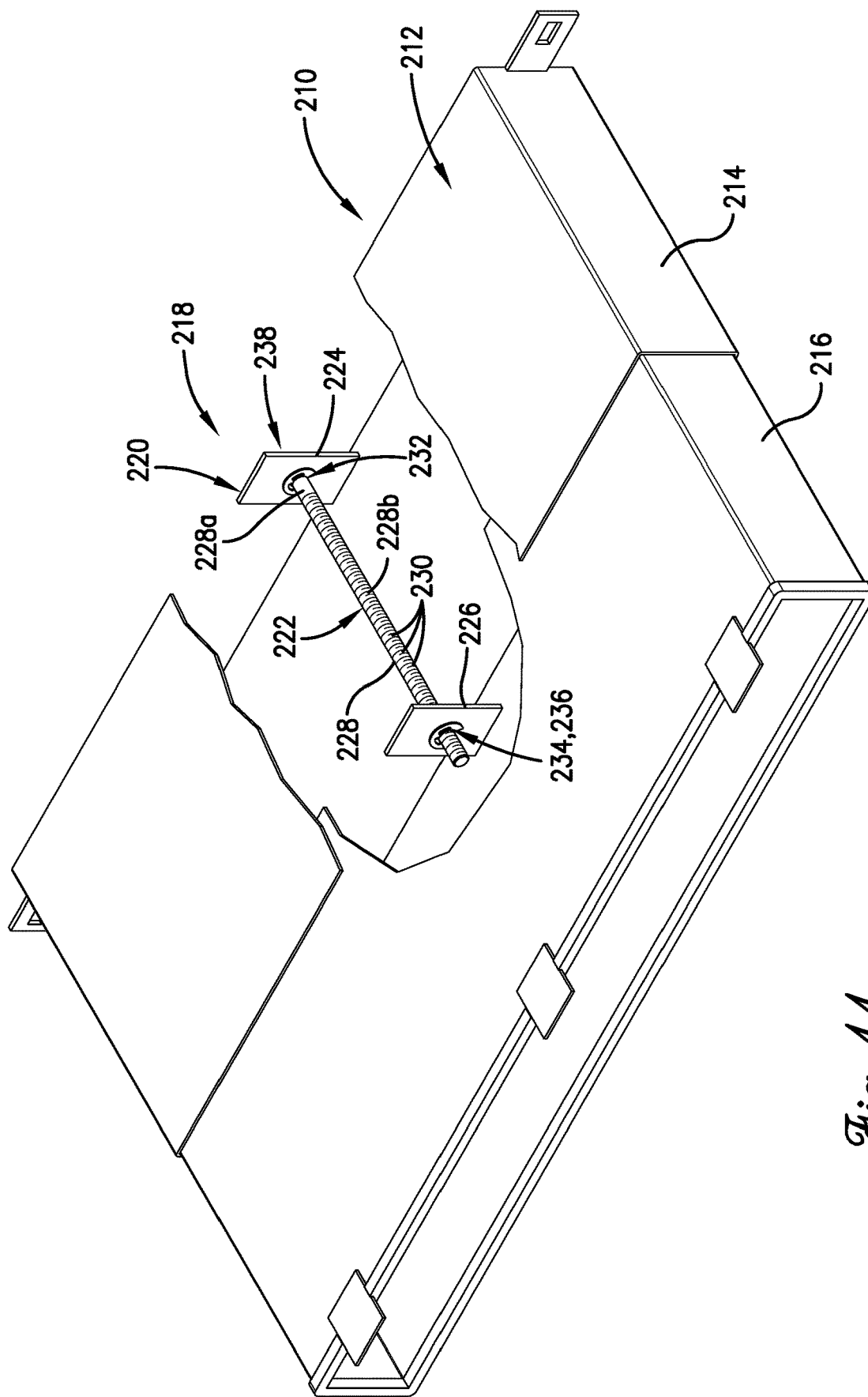
FIG. 11 is a partially fragmented rear perspective view of a duct in accordance with a second preferred embodiment of the present invention.

It is also noted that more or fewer duct sections and/or drive assemblies might be provided. For instance, a four-section duct driven by three drive assemblies might be provided, or a two-section duct might be provided and driven by a single drive assembly. A second preferred embodiment of the present invention, featuring the latter design, is illustrated in FIG. 11. It is initially noted that, with certain exceptions to be discussed in detail below, many of the elements of the duct 210 of the second embodiment are the same as or very similar to those described in detail above in relation to the duct 16 of the first embodiment. Therefore, for the sake of brevity and clarity, redundant descriptions and numbering will be generally avoided here. Unless otherwise specified, the detailed descriptions of the elements presented above with respect to the first embodiment should therefore be understood to apply at least generally to the second embodiment, as well.

Similarly to the duct 16, the duct 210 includes a body 212. However, rather than including relatively shiftable proximal (front), intermediate (middle), and distal (rear) sections, the duct 210 includes only proximal and distal sections 214 and 216. The duct 210 also preferably includes a drive mechanism 218 including only one drive assembly 220.

The drive assembly 220 includes a fixed rod 222, a proximal fixed rod support 224, and a distal fixed rod support 226. The fixed rod 222 preferably includes a body 228 having a proximal smooth (i.e., non-threaded) portion 228a, an intermediate threaded portion 228b that defines external threads 230, and a distal smooth (i.e., non-threaded) portion 228c. The proximal fixed rod support 224 preferably defines a smooth (i.e., non-threaded) opening 232 therethrough. In contrast, the distal fixed rod support 226 preferably has internal threads 234 defining an internally threaded opening 236.

The proximal fixed rod support 224 is preferably fixed to the proximal section 214. The distal fixed rod support is preferably fixed to the distal section 216.

The fixed rod 222 preferably has a proximal access end 238 disposed forward of and most preferably in contact with the proximal fixed rod support 224.

In a similar manner to that described above with regard to the first preferred embodiment, rotation of the fixed rod 222 results in longitudinal shifting of the fixed rod 222 through the threaded opening 236 and relative to the distal fixed rod support 226. Such relative shifting is manifested by shifting of the proximal and distal duct sections 214 and 216, respectively, relative to each other. That is, rotation of the rod 222 results in longitudinal travel of the distal fixed rod support 226 and, in turn, the distal section 216, along the threaded portion 228b of the fixed rod 222 (and therefore into or out of the proximal section 214).

CONCLUSION

Features of one or more embodiments described above may be used in various combinations with each other and/or may be used independently of one another. For instance, although a single disclosed embodiment may include a preferred combination of features, it is within the scope of certain aspects of the present invention for the embodiment to include only one (1) or less than all of the disclosed features, unless the specification expressly states otherwise or as might be understood by one of ordinary skill in the art. Therefore, embodiments of the present invention are not necessarily limited to the combination(s) of features described above.

The preferred forms of the invention described above are to be used as illustration only and should not be utilized in a limiting sense in interpreting the scope of the present invention. Obvious modifications to the exemplary embodiments, as hereinabove set forth, could be readily made by those skilled in the art without departing from the spirit of the present invention.

Although the above description presents features of preferred embodiments of the present invention, other preferred embodiments may also be created in keeping with the principles of the invention. Furthermore, as noted previously, these other preferred embodiments may in some instances be realized through a combination of features compatible for use together despite having been presented independently as part of separate embodiments in the above description.

The inventors hereby state their intent to rely on the Doctrine of Equivalents to determine and access the reasonably fair scope of the present invention as pertains to any apparatus not materially departing from but outside the literal scope of the invention set forth in the following claims.

What is claimed is:

1. A data center rack assembly comprising:
a rack;
an electronic device; and
an adjustable air duct,
said rack including a frame defining opposite first and second rack sides spaced apart in a longitudinal direction,
said electronic device presenting an intake side configured to receive air therethrough for passage into the electronic device,
said electronic device mounted to the frame such that the intake side is disposed intermediately between the rack sides and is spaced from the first rack side to define a longitudinal dimension therebetween,
said duct including—
relatively shiftable first and second duct sections that extend in the longitudinal direction to cooperatively present an adjustable longitudinal duct length, and
a drive mechanism operably coupled to said first and second sections such that operation of the drive mechanism results in relative shifting of the sections.

2. The data center rack assembly of claim 1,
said drive mechanism and said first and second sections being sized and configured such that the duct is extendable from the front side of the rack to the intake side of the electronic device to contact the intake side of the electronic device such that the duct length and the longitudinal dimension are equal.

3. The data center rack assembly of claim 1,
wherein at least one of the operation of the drive mechanism and the relative shifting of the sections involves rotation and the other of the operation of the drive mechanism and the relative shifting of the sections involves longitudinal shifting.

4. The data center rack assembly of claim 3,
said drive mechanism including a rotatable component, with rotation of the component resulting in longitudinal shifting of the first and second sections relative to one another.

5. The data center rack assembly of claim 4,
said component comprising a rod.

6. The data center rack assembly of claim 5,
said rod including external threads,
said drive mechanism further including a rod support fixed to one of said first and second sections,
said rod support having internal threads defining an internally threaded opening,
said rod extending through said opening such that the external threads of the rod engage the internal threads of the rod support,
rotation of said rod resulting in longitudinal shifting of the rod through the opening and relative to the rod support.

7. The data center rack assembly of claim 5,
said rod having an access end,
said first section having an edge closest to the first rack side, said access end being disposed at least substantially in alignment with said edge.

8. The data center rack assembly of claim 7,
said access end including a tool-receiving recess configured to receive at least a portion of a rotatable tool, wherein rotation of said rotatable tool when at least a portion thereof is received in the tool-receiving recess results in rotation of said rod.

9. The data center rack assembly of claim 1,
said first rack side being a front side and said second rack side being a back side, such that the longitudinal direction is a fore-aft direction,
said first and second sections each including respective front and back edges,
said front edge of the second section being disposed forward of the back edge of the first section, such that an overlapping region is formed cooperatively by the first and second sections,
said overlapping region having an overlapping region length that varies as the first and second sections shift relative to each other.

10. The data center rack assembly of claim 1,
said duct further including an intermediate section disposed longitudinally between and in at least partial overlapping engagement with said first and second sections.

11. The data center rack assembly of claim 10,
said drive mechanism being operably coupled to said intermediate section to control relative shifting of the first and intermediate sections in the longitudinal direction and the third and intermediate sections in the longitudinal direction,
each of said first, intermediate, and second sections thereby being longitudinally shiftable relative to one another.

12. The data center rack assembly of claim 11,
wherein at least one of the operation of the drive mechanism and the relative shifting of the sections involves rotation and the other of the operation of the drive mechanism and the relative shifting of the sections involves longitudinal shifting.

13. The data center rack assembly of claim 12,
said drive mechanism including a first rotatable component and a second rotatable component,
said first component being mounted relative to said first and intermediate sections such that rotation of the first component results in longitudinal shifting of the first and intermediate sections relative to one another,
said second component being mounted relative to said intermediate and third sections such that rotation of the second component results in longitudinal shifting of the intermediate and third sections relative to one another.

14. The data center rack assembly of claim 13,
said first component comprising a first rod,
said second component comprising a second rod.

15. The data center rack assembly of claim 14,
each of said first and second rods including external threads,
said drive mechanism further including first and second rod supports fixed to respective ones of the first and second sections,
each of said first and second rod supports having internal threads defining respective first and second internally threaded openings,
said first rod extending though said first opening such that the external threads of the first rod engage the internal threads of the first rod support,
said second rod extending though said second opening such that the external threads of the second rod engage the internal threads of the second rod support,
rotation of said first rod resulting in longitudinal shifting of the first rod through the first opening and relative to the first rod support,
rotation of said second rod resulting in longitudinal shifting of the second rod through the second opening and relative to the second rod support.

16. The data center rack assembly of claim 15,
each of said first and second rods having an access end,
said first section having an edge closest to the first rack side,
said access ends each being disposed at least substantially in alignment with said first edge.

17. The data center rack assembly of claim 16,
each of said access ends including a tool-receiving recess configured to receive at least a portion of a rotatable tool, wherein rotation of said rotatable tool when at least a portion thereof is received in either of the tool-receiving recesses results in rotation of the corresponding one of the first and second rods.

18. The data center rack assembly of claim 14,
said second rod including a rail portion and a traveling portion,
said traveling portion defining a longitudinally extending rail-receiving channel,
said rail portion being at least in part received within said channel,
said rail portion being longitudinally shiftable within said channel such that the traveling portion is longitudinally shiftable along the rail portion.

19. The data center rack assembly of claim 18,
said rail portion and said channel being configured such that rotation of said rail portion drives rotation of said traveling portion.

20. The data center rack assembly of claim 19,
each of said first rod and said traveling portion including external threads,
said drive mechanism further including first and second rod supports fixed to respective ones of the first and second sections,
each of said first and second rod supports having internal threads defining respective first and second internally threaded openings,
said first rod extending though said first opening such that the external threads of the first rod engage the internal threads of the first rod support,
said traveling portion extending though said second opening such that the external threads of the traveling portion engage the internal threads of the second rod support,
rotation of said first rod resulting in longitudinal shifting of the first rod through the first opening and relative to the first rod support,
rotation of said second rod resulting in longitudinal shifting of the traveling portion through the second opening and relative to the second rod support.

* * * * *